United States Patent
Cho et al.

(10) Patent No.: US 7,167,060 B2
(45) Date of Patent: Jan. 23, 2007

(54) OSCILLATION CIRCUITS INCLUDING LATCHES FOR INTEGRATED CIRCUIT DEVICES AND RELATED METHODS

(75) Inventors: Hyun-Duk Cho, Gyeonggi-do (KR); Pyung-Moon Zhang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/021,587

(22) Filed: Dec. 22, 2004

(65) Prior Publication Data

US 2006/0061422 A1   Mar. 23, 2006

(30) Foreign Application Priority Data

Sep. 22, 2004   (KR) .................. 10-2004-0076031

(51) Int. Cl.
*H03K 3/27*   (2006.01)
(52) U.S. Cl. ...................... 331/143; 331/111
(58) Field of Classification Search ............. 331/111, 331/113 R, 143, 144
See application file for complete search history.

(56) References Cited

U.S. PATENT DOCUMENTS 5,532,653 A * 7/1996 Adkins ................. 331/143
5,638,418 A * 6/1997 Douglass et al. ......... 377/25
5,870,345 A * 2/1999 Stecker .................. 365/222
6,028,492 A   2/2000 Matsubara

FOREIGN PATENT DOCUMENTS

| KR | 00144998 | 4/1998 |
| KR | 0024457 | 6/1998 |
| KR | 0027056 | 5/2000 |

* cited by examiner

*Primary Examiner*—Robert Pascal
*Assistant Examiner*—James Goodley
(74) *Attorney, Agent, or Firm*—Myers Bigel Sibley & Sajovec

(57) ABSTRACT

An oscillator circuit may include a latch circuit, a feed-back circuit, and an input circuit. The latch circuit may be configured to generate an oscillating output signal responsive to first and second input signals, and the feed-back circuit may be configured to generate first and second complementary feed-back signals responsive to the oscillating output signal from the latch circuit. The input circuit may be configured to generate the first and second input signals responsive to the first and second complementary feed-back signals. Related methods are also discussed.

18 Claims, 4 Drawing Sheets

US 7,167,060 B2

OSCILLATION CIRCUITS INCLUDING LATCHES FOR INTEGRATED CIRCUIT DEVICES AND RELATED METHODS

This application claims the benefit of and priority under 35 U.S.C. Sec. 119 to Korean Patent Application No. 2004-76031, filed on Sep. 22, 2004, the disclosure of which is incorporated herein by reference in its entirety.

FIELD OF THE INVENTION

The present invention relates to electronic circuits and, more particularly, to oscillation circuits and related methods.

BACKGROUND OF THE INVENTION

In general, some semiconductor devices such flash memories may use relatively high voltages to perform erase and/or program operations. Accordingly, high voltage generators may be included in the semiconductor devices to generate high voltages. A high voltage generator may include a plurality of charge pumps which are connected in series. Each of the charge pumps may generate a high voltage using a pumping operation in response to a predetermined oscillation signal. At this time, the oscillation signal may be generated by an internal oscillation circuit included in the semiconductor device. FIG. 1 shows an oscillation circuit used in a conventional semiconductor device. With reference to FIG. 1, the conventional oscillation circuit 100 includes a detection unit 110, a comparator 120, and a latch unit 130.

The detection unit 110 includes a first detector 112 and a second detector 114, which have a same circuit construction. In addition, the detection unit 110 receives first and second feedback signals VF1A and VF2A and the detection unit 110 generates first and second detection signals VD1A and VD2A. The first and second feedback signals VF1A and VF2A are fed-back from a latch unit 130. The first and second detection signals VD1A and VD2A are charged responsive to a voltage level of the first and second feedback signals VF1A and VF2A. Each of detectors 112 and 114 includes a P-MOS transistor (P1A or P2A), two N-MOS transistors (N1A and N2A, or N3A and N4A), and a capacitor (C1A or C2A). The P-MOS transistor (P1A or P2A) is connected in a series between a power voltage VDD and a ground voltage VSS. The P-MOS transistor (P1A or P2A) and one N-MOS transistor (N1A or N3A) are turned on and off responsive to a feedback signal (VF1A or VF2A). Another N-MOS transistor (N2A or N4A) is turned on and off responsive to a reference voltage $V_{refa}$ having a constant voltage level.

The comparator unit 120 includes two comparators 122 and 124, which are embodied using respective differential amplifiers. Each of comparators 122 and 124 compares the reference voltage $V_{refa}$ with a respective detection signal VD1A and VD2A provided by the detection unit 110 to generate comparison signals VC1A and VC2A.

As shown in FIG. 1, the latch unit 130 may be an SR (set-reset) latch including two NAND gates 132 and 134. Outputs of the SR latch may be first and second feedback signals VF1A and VF2A which are fed-back to the detection unit 110. In addition, the second feedback signal VF2A may be used as the output of oscillation circuit 100 (an oscillation signal OSCA). As is well known to those skilled in the art, outputs of the NAND gates of the SR latch may be complementary with respect to each other. If two inputs of each NAND gate are "0", two outputs of the SR latch may be fixed to "1".

FIG. 2 is a waveform illustrating an oscillation signal according to variations of external power in a conventional oscillation circuit. In the conventional oscillation circuit, a power source voltage may dip to a range in which the differential amplifier may be inoperative (A), and a voltage level (an output of each differential amplifier) of first and second comparison signals VC1A and VC2A may have a level of a ground voltage VSS. Accordingly, two outputs of the latch unit 130 embodied by the SR latch may become "0" so that a power voltage VDD of first and second feedback signals VF1A and VF2A (outputs of the latch unit 130) may be fixed to a level of the power voltage VDD. Thus, even if a power of a normal range is provided after power-dipping of the external power source, an output of the oscillation circuit 100 may still be fixed to a level of the power voltage VDD. As a result, oscillation operation may not restart.

Oscillation circuits are disclosed, for example, in Korean Laid-Open Patent Publication No. 2000-0027506 entitled "AN OSCILATOR FOR GENERATING HIGH VOLTAGE OF FALSH MEMORY DEVICE", the disclosure of which is hereby incorporated herein in its entirety by reference.

SUMMARY OF THE INVENTION

An oscillator circuit may include a latch circuit, a feedback circuit, and an input circuit. The latch circuit may be configured to generate an oscillating output signal responsive to first and second input signals, and the feed-back circuit may be configured to generate first and second complementary feed-back signals responsive to the oscillating output signal from the latch circuit. The input circuit may be configured to generate the first and second input signals responsive to the first and second complementary feed-back signals.

More particularly, the input circuit may include a detection circuit and a comparator circuit. The detection circuit may be configured to generate first and second detection signals responsive to the first and second feed-back signals. The comparator circuit may be configured to compare the first and second detection signals with a reference voltage and to generate the first and second input signals responsive to comparing the first and second detection signals with the reference voltage. The detection circuit may include a first detector configured to generate the first detection signal responsive to the first feed-back signal and a second detector configured to generate the second detection signal responsive to the second feed-back signal.

Moreover, the first detector may include a PMOS transistor coupled between a power supply voltage and a node with the first feed-back signal being provided at a gate of the PMOS transistor. In addition, an NMOS transistor may be coupled in series between the node and a ground voltage, with the first feed-back signal being provided at a gate of the NMOS transistor, and with the first detection signal being generated at the node between the PMOS and NMOS transistors. The first detector may further include a second NMOS transistor and a capacitor. The second NMOS transistor may be coupled in series with the first NMOS transistor between the node and the ground voltage with the reference voltage being provided at a gate of the second NMOS transistor. The capacitor may be coupled between the node and the ground voltage in parallel with the first and second NMOS transistors.

Similarly, the second detector may include a PMOS transistor coupled between a power supply voltage and a node, with the second feed-back signal being provided at a gate of the PMOS transistor. In addition, an NMOS transistor may be coupled in series between the node and a ground voltage, with the second feed-back signal being provided at a gate of the NMOS transistor, and with the second detection signal being generated at the node between the PMOS and NMOS transistors. The second detector may further include a second NMOS transistor and a capacitor. The second NMOS transistor may be coupled in series with the first NMOS transistor between the node and the ground voltage with the reference voltage being provided at a gate of the second NMOS transistor. The capacitor may be coupled between the node and the ground voltage in parallel with the first and second NMOS transistors.

The comparator circuit may include first and second comparators. The first comparator may be configured to generate the first input signal responsive to comparing the first detection signal with the reference voltage, and the second comparator may be configured to generate the second input signal responsive to comparing the second detection signal with the reference voltage. More particularly, the first comparator may be a first differential amplifier, and the second comparator may be a second differential amplifier.

The latch circuit may be a set-reset latch circuit including first and second cross-coupled logic gates, with the oscillating output signal being generated at an output of the first of the cross-coupled logic gates. The feed-back circuit may include a delay circuit configured to delay the oscillating output signal, a first inverter configured to invert the delayed oscillating output signal thereby generating the first feed-back signal, and a second inverter configured to invert the first feed-back signal thereby generating an oscillator output. Moreover, the delay circuit may include a plurality of inverters coupled in series.

According to additional embodiments of the present invention, methods may be provided for generating oscillating signals. An oscillating output signal may be generated responsive to first and second input signals, and first and second complementary feed-back signals may be generated responsive to the oscillating output signal. First and second input signals may be generated responsive to the first and second complementary feed-back signals.

More particularly, generating the first and second input signals may include generating first and second detection signals responsive to the first and second feed-back signals. The first and second detection signals may be compared with a reference voltage, and the first and second input signals may be generated responsive to comparing the first and second detection signals with the reference voltage. Moreover, generating the first and second detection signals may include generating the first detection signal responsive to the first feed-back signal and generating the second detection signal responsive to the second feed-back signal. In addition, generating the first and second complementary feed-back signals may include delaying the oscillating output signal, inverting the delayed oscillating output signal to thereby generate the first feed-back signal, and inverting the first feed-back signal to thereby generate an oscillator output.

Oscillation circuits according to embodiments of the present invention may be capable of restarting a normal oscillation operation when an external power supply is returned to a normal level after stopping an oscillation operation of an oscillation circuit due to a power dipping of the external power supply in a semiconductor memory device.

According to some embodiments of the present invention, an oscillation circuit may include a detection unit for receiving first and second feedback signals having an inverse phase with respect to each other and a reference voltage having a constant voltage to generate first and second detection signals whose voltage levels change respectively according to the first and second feedback signals. A comparator unit may compare the reference voltage with the voltage level of the first detection signal to generate a first comparison signal, and the comparator unit may compare the reference signal with the voltage level of the second detection signal to generate a second comparison signal. A latch unit may receive the first and second comparison signals to generate an oscillation signal and a restart unit may generate the first and second feedback signals using the oscillation signal.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another embodiment, element, component region, layer or section. Thus, a first embodiment, component, element, region, layer or section discussed below could be termed a second embodiment, component, element, region, layer or section, and, similarly, a second embodiment, component, element, region, layer or section could be termed a first embodiment, component, element, region, layer or section without departing from the teachings of the present invention. The term "directly" means that there are no intervening elements. Finally, as used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
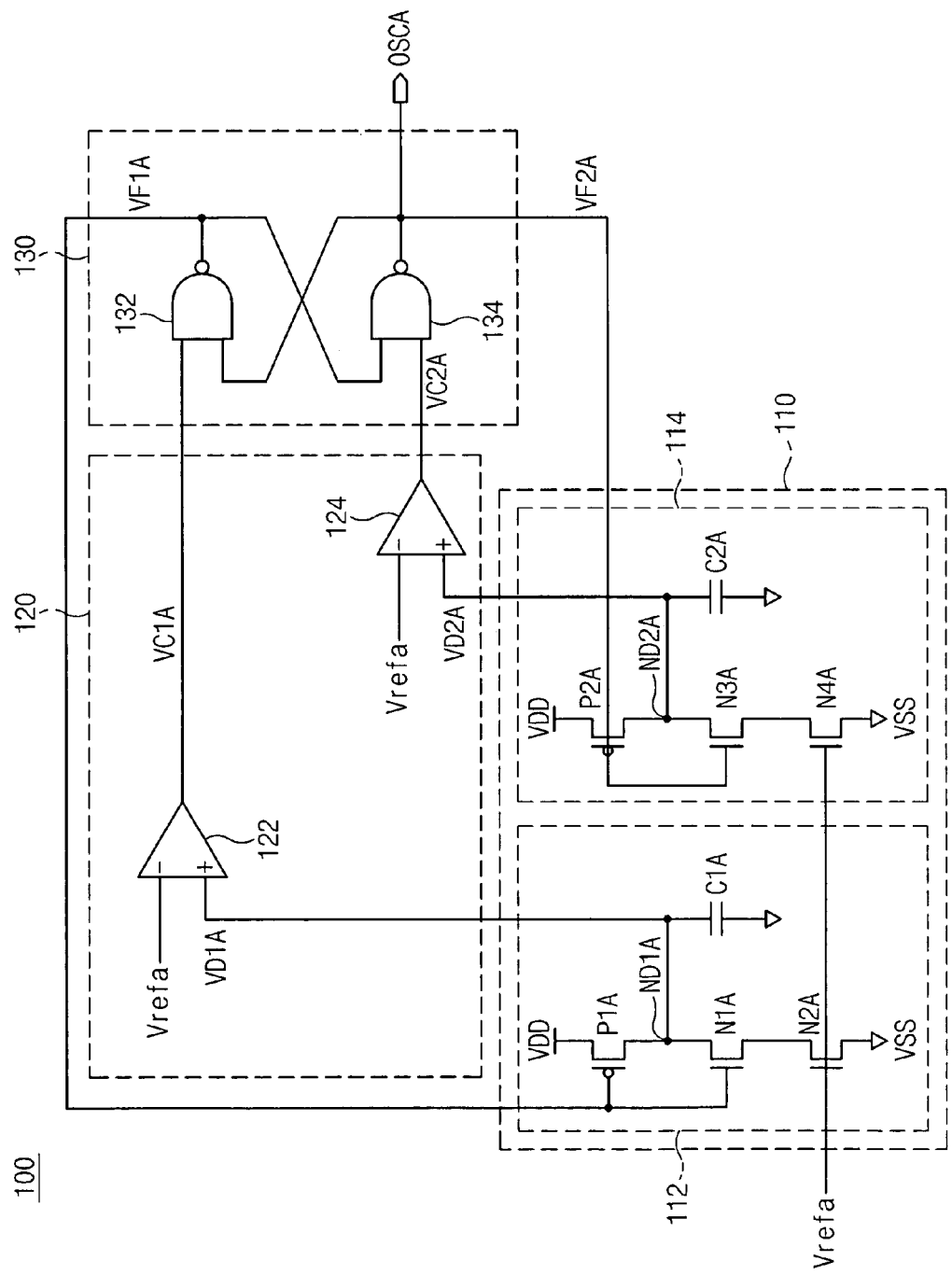
FIG. 1 is a schematic diagram illustrating an oscillation circuit used in a conventional memory device.
Figure 2:
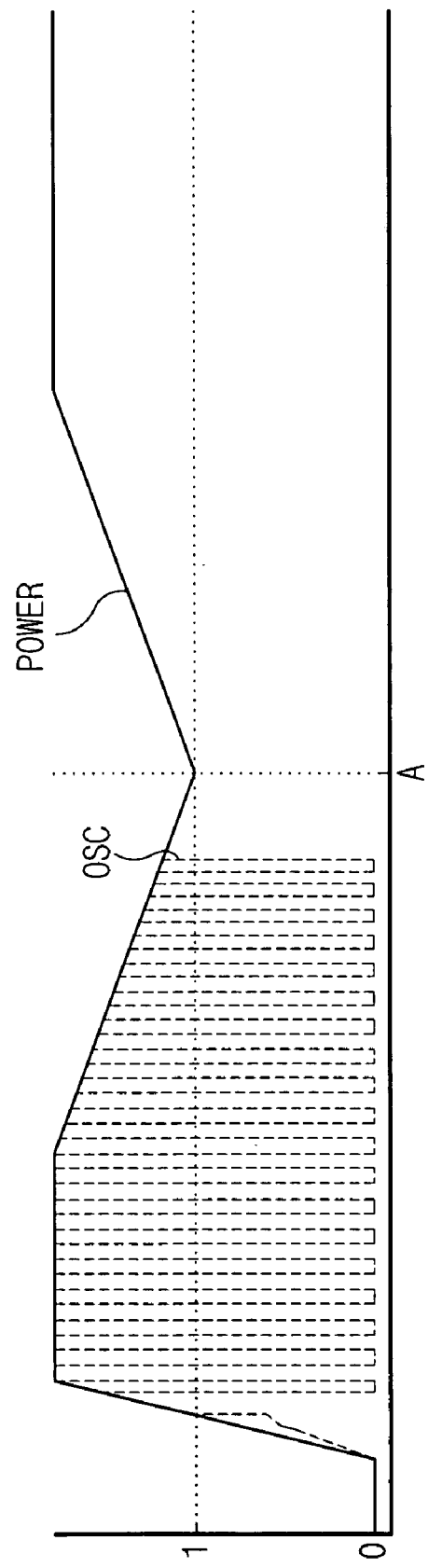
FIG. 2 is a waveform illustrating an oscillation signal as a function of variations of external power in the conventional oscillation circuit of FIG. 1.
Figure 3:
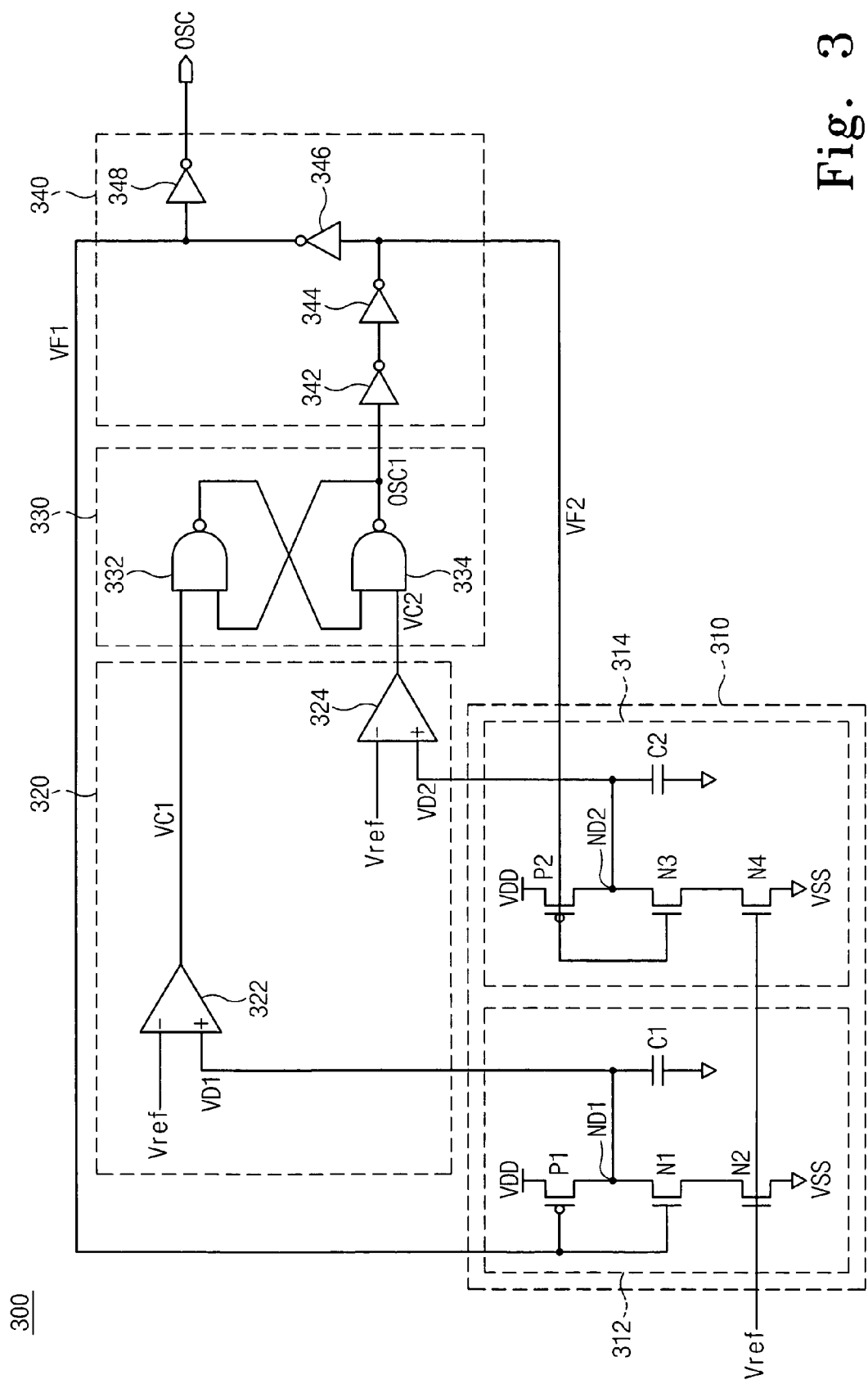
FIG. 3 is a schematic diagram illustrating oscillation circuits according to some embodiments of the present invention.

FIG. 3 illustrates an oscillation circuit according to some embodiments of the present invention. With reference to FIG. 3, the oscillation circuit includes a detection unit 310, a comparator unit 320, a latch unit 330, and a restart unit 340.

As shown in FIG. 3, the detection unit 310 includes first and second detectors 312 and 314, which may have a same circuit construction. In addition, the detection unit 310 receives a reference voltage $V_{ref}$ and first and second feedback signals VF1 and VF2 used to generate first and second detection signals VD1 and VD2. The first and second feedback signals VF1 and VF2 are fed-back from the latch unit 330, and the first and second detection signals VD1 and VD2 change responsive to changes in voltage levels of the first and second feedback signals VF1 and VF2. The first detector 312 includes a first P-MOS transistor P1, first and second N-MOS transistors N1 and N2, and a capacitor C1. The first P-MOS transistor P1 is connected between a power voltage VDD and a first node ND1. The first and second N-MOS transistors N1 and N2 are connected in series between the first node ND1 and a ground voltage VSS. A capacitor C1 is connected between the first node ND1 and the ground voltage VSS. The P-MOS transistor P1 and the N-MOS transistor N1 of the first detector 312 are turned on and off responsive to the first feedback signal VF1 from the restart unit 340, which is applied to gate terminals of the P-MOS transistor P1 and the N-MOS transistor N1. The second N-MOS transistor N2 is turned on and off responsive to on a reference voltage $V_{ref}$.

In the first detector 312 having such a circuit construction, if the first feedback signal VF1 is high, the first P-MOS transistor P1 is turned off, and the first N-MOS transistor is turned on. As a result, charge from the capacitor C1 is discharged. Therefore, if the first feedback signal VF1 is high, the first detector 312 generates the first detection signal VD1 having a ground voltage VSS level. If the first feedback signal VF1 is low, the first P-MOS transistor P1 is turned on, and the first N-MOS transistor N1 is turned off. As a result, the capacitor C1 is charged from the power voltage VDD through the P-MOS transistor P1. Accordingly, if the first feedback signal VF1 is low, the first detector 312 generates the first detection signal VD1 having a power voltage VDD level.

As shown in FIG. 3, the second detector 314 is controlled by a voltage level of the second feedback signal VF2 instead of the first feedback signal VF1. Excepting this difference, the second detector 314 has the same circuit construction as the first detector 312. If a voltage level of the second feedback signal VF2 is high, the second detector 314 may generate a second detection signal VD2 having a ground voltage VSS level. If the voltage level of the second feedback signal VF2 is low, the second detector 314 may generate a second detection signal VD2 having a power voltage VDD level.

The comparator unit 320 may include first and second comparators 322 and 324, which are embodied as differential amplifiers. The first comparator 322 compares the reference voltage $V_{ref}$ with a first detection signal VD1 from the first detector 312 and generates a first comparison signal VC1 responsive to the comparison. The second comparator 324 compares the reference voltage $V_{ref}$ with the second detection signal VD2 and generates a second comparison signal VC2 responsive to the comparison. That is, if the first detection signal VD1 is at the power voltage VDD level, the first comparator 322 receives the reference voltage $V_{ref}$ and the first detection signal VD1 and generates a first comparison signal VC1 having a power voltage VDD level. If the first detection signal VD1 is at the ground voltage VSS level, the first comparator 322 generates the first comparison signal VC1 having the ground voltage VCC level. In the same way, the second comparator 324 receives the reference voltage $V_{ref}$ and the second detection signal VD2 and generates the second comparison signal VC2 responsive to a voltage level of the second detection signal VD2. The reference voltage $V_{ref}$ may have a relatively constant voltage level between the VDD and VSS voltage levels.

The latch unit 330 may be embodied as an SR (set-reset) latch with two NAND gates 332 and 334. The latch unit 330 receives the first and second comparison signals VC1 and VC2 from the comparator 320 at the respective NAND gates 332 and 334. An output of each NAND gate is applied to an input of the other NAND gate. In addition, the latch unit 330 generates a first oscillation signal OSC1 from one of the two NAND gates 332 and 334.

The restart unit 340 generates first and second feedback signals VF1 and VF2 having inverse phase with respect to each other using the first oscillation signal OSC1 from the latch unit 330, and the feed-back signals VF1 and VF2 are fed-back to the detection unit 310. After that, the restart unit 340 generates an oscillation signal OSC which may be the inverse of the first feedback signal VF1. More particularly, the restart unit 340 may include first and second inverters 342 and 344, a third inverter 346, and a fourth inverter 348. The first and second inverters 342 and 344 may be connected in series and may generate the second feedback signal VF2 by delaying the first oscillation signal OSC from the latch unit 330. The third inverter 346 may generate the first feedback signal VF1 by inverting the second feedback signal VF2. The fourth inverter 348 may generate the oscillation signal OSC by inverting the output of the third inverter 346 (the first feedback signal VF1). Through these processes, the restart unit 340 generates the first and second feedback signals VF1 and VF2, which will have an inverse phase as a result of inverter 346, and the feed-back signals VF1 and VF2 are fed-back to the detection unit 310.

Figure 4:
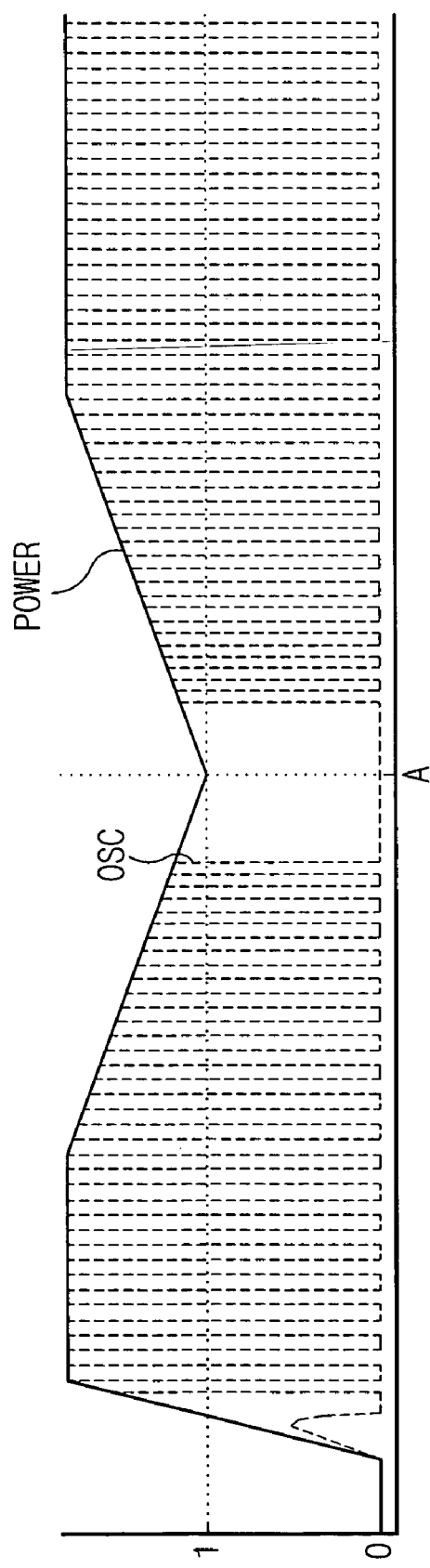
FIG. 4 is a waveform illustrating an oscillation signal as a function of variations of external power in the oscillation circuit of FIG. 3.

FIG. 4 is a waveform illustrating an oscillation signal as a function of variations of an external power supply in oscillation circuits according to embodiments some of the present invention. As shown in FIG. 4, the restart unit 340 may reduce mis-operations of the oscillation circuit 300. In this case, a mis-operation may occur in a low power condition by stopping oscillation when an external power POWER dips such that the differential amplifiers do not operate properly. If the external power POWER returns to a normal level, the oscillation circuit 300 may restart oscillation operations automatically as a result of the restart unit 340. In particular, the first and second feedback signals VF1 and VF2 that are fed-back by the restart unit 340 will have an inverse phase as a result of inverter 346. That is, detection signals VD1 and VD2 having different voltage levels may be generated using the complementary feedback signals VF1 and VF2, thereby providing different (i.e. complementary) comparison signals VC1 and VC2, which are provided to the latch unit 30. As a result, the oscillation circuit 300 may restart oscillation operations automatically.

As previously mentioned, oscillation circuits according to some embodiments of the present invention may stop oscillation in a low power condition due to a power dip in such a manner that mis-operations of the oscillation circuit may be reduced. In addition, the oscillation circuit may be capable of restarting an oscillation operation automatically if an external power is returned to a normal operation voltage.

Oscillation circuits according to some embodiments of the present invention can thus be used to drive one or more charge pumps for high voltage generation. More particularly, oscillation circuits according to further embodiments of the present invention can be used to drive one or more charge pumps for high voltage generation in memory devices such as flash memory devices.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. An oscillator circuit comprising:
a latch circuit configured to generate an oscillating output signal responsive to first and second input signals;
a feed-back circuit configured to generate first and second complementary feed-back signals responsive to the oscillating output signal from the latch circuit; and
an input circuit configured to generate the first and second input signals responsive to the first and second complementary feed-back signals wherein the input circuit includes,
 a detection circuit configured to generate first and second detection signals responsive to the first and second feed-back signals and responsive to a reference signal separate from the first and second feed-back signals, and
 a comparator circuit configured to compare the first and second detection signals with the reference signal and to generate the first and second input signals responsive to comparing the first and second detection signals with the reference signal.

2. An oscillator circuit according to claim 1 wherein the detection circuit includes a first detector configured to generate the first detection signal responsive to the first feed-back signal and responsive to the reference signal and a second detector configured to generate the second detection signal responsive to the second feed-back signal and responsive to the reference signal.

3. An oscillator circuit according to claim 2 wherein the first detector includes a PMOS transistor coupled between a power supply voltage and a node, wherein the first feed-back signal is provided at a gate of the PMOS transistor, and an NMOS transistor coupled in series between the node and a ground voltage, wherein the first feed-back signal is provided at a gate of the NMOS transistor, and wherein the first detection signal is generated at the node between the PMOS and NMOS transistors.

4. An oscillator circuit according to claim 3 wherein the first detector further includes a second NMOS transistor coupled in series with the first NMOS transistor between the node and the ground voltage wherein the reference signal is provided at a gate of the second NMOS transistor, and a capacitor coupled between the node and the ground voltage in parallel with the first and second NMOS transistors.

5. An oscillator circuit according to claim 2 wherein the second detector includes a PMOS transistor coupled between a power supply voltage and a node, wherein the second feed-back signal is provided at a gate of the PMOS transistor, and an NMOS transistor coupled in series between the node and a ground voltage, wherein the second feed-back signal is provided at a gate of the NMOS transistor, and wherein the second detection signal is generated at the node between the PMOS and NMOS transistors.

6. An oscillator circuit according to claim 5 wherein the second detector further includes a second NMOS transistor coupled in series with the first NMOS transistor between the node and the ground voltage wherein the reference signal is provided at a gate of the second NMOS transistor, and a capacitor coupled between the node and the ground voltage in parallel with the first and second NMOS transistors.

7. An oscillator circuit according to claim 1 wherein the comparator circuit includes a first comparator configured to generate the first input signal responsive to comparing the first detection signal with the reference signal, and a second comparator configured to generate the second input signal responsive to comparing the second detection signal with the reference signal.

8. An oscillator circuit according to claim 7 wherein the first comparator comprises a first differential amplifier and the second comparator comprises a second differential amplifier.

9. An oscillator circuit according to claim 1 wherein the latch circuit comprises a set-reset latch circuit.

10. An oscillator circuit according to claim 1 wherein the feed-back circuit includes a delay circuit configured to delay the oscillating output signal, a first inverter configured to invert the delayed oscillating output signal thereby generating the first feed-back signal, and a second inverter configured to invert the first feed-back signal thereby generating an oscillator output.

11. An oscillator circuit according to claim 10 wherein the delay circuit includes a plurality of inverters coupled in series.

12. An oscillator circuit according to claim 1 wherein the latch circuit includes first and second cross-coupled logic gates, and wherein the oscillating output signal is generated at an output of the first of the cross-coupled logic gates.

13. An oscillator circuit according to claim 1 further comprising:
a charge pump coupled with at least one of the latch circuit and/or the feed-back circuit.

14. A method of generating an oscillating signal, the method comprising:
generating an oscillating output signal responsive to first and second input signals;
generating first and second complementary feed-back signals responsive to the oscillating output signal; and
generating the first and second input signals responsive to the first and second complementary feed-back signals wherein generating the first and second input signals includes,
generating first and second detection signals responsive to the first and second feed-back signals and responsive to a reference signal separate from the first and second feed-back signals,
comparing the first and second detection signals with the reference signal, and
generating the first and second input signals responsive to comparing the first and second detection signals with the reference signal.

15. A method according to claim 14 wherein generating the first and second detection signals includes generating the first detection signal responsive to the first feed-back signal and responsive to the reference signal and generating the second detection signal responsive to the second feed-back signal and responsive to the reference signal.

16. A method according to claim 14 wherein generating the first and second complementary feed-back signals include delaying the oscillating output signal, inverting the delayed oscillating output signal to thereby generate the first feed-back signal, and inverting the first feed-back signal to thereby generate an oscillator output.

17. An oscillation circuit comprising:
- a detection unit for receiving first and second feedback signals having an inverse phase each other and a reference voltage having a constant voltage to output first and second detection signals whose voltage levels are changed respectively according to the first and second feedback signals;
- a comparator unit for comparing the reference voltage with the voltage level of the first detection signal to output a first comparison signal, the comparator unit for comparing the reference signal with the voltage level of the second detection signal to output a second comparison signal;
- a latch unit for receiving the first and second comparison signals to output an oscillation signal; and
- a restart unit for generating the first and second feedback signals using the oscillation signal.

18. The oscillation circuit of claim 17, wherein the detection unit comprises:
- a first detector for generating the first detection signal whose voltage level is changed according to the first feedback signal; and
- a second detector for generating the second detection signal whose voltage level is changed according to the second feedback signal.

* * * * *